United States Patent
Negishi et al.

(10) Patent No.: US 10,482,587 B2
(45) Date of Patent: Nov. 19, 2019

(54) APPARATUS HAVING TRANSFER CONTROL BASED ON IMAGED IMAGE

(71) Applicant: DISCO CORPORATION, Tokyo (JP)

(72) Inventors: Katsuharu Negishi, Tokyo (JP); Kazunari Tanaka, Tokyo (JP)

(73) Assignee: DISCO CORPORATION, Tokyo (JP)

(*) Notice: Subject to any disclaimer, the term of this patent is extended or adjusted under 35 U.S.C. 154(b) by 17 days.

(21) Appl. No.: 15/424,239

(22) Filed: Feb. 3, 2017

(65) Prior Publication Data

US 2017/0236267 A1 Aug. 17, 2017

(30) Foreign Application Priority Data

Feb. 12, 2016 (JP) ................. 2016-024888

(51) Int. Cl.
| | |
|---|---|
| *G06T 7/00* | (2017.01) |
| *H01L 21/78* | (2006.01) |
| *H01L 21/67* | (2006.01) |
| *H01L 21/68* | (2006.01) |
| *G06K 9/62* | (2006.01) |
| *H04N 5/232* | (2006.01) |

(52) U.S. Cl.
CPC .......... *G06T 7/0004* (2013.01); *G06K 9/6201* (2013.01); *H01L 21/67092* (2013.01); *H01L 21/67288* (2013.01); *H01L 21/681* (2013.01); *H01L 21/78* (2013.01); *H04N 5/23293* (2013.01); *G06K 2209/19* (2013.01); *G06T 2207/30148* (2013.01)

(58) Field of Classification Search
None
See application file for complete search history.

(56) References Cited

U.S. PATENT DOCUMENTS

| | | | | |
|---|---|---|---|---|
| 4,754,334 A * | 6/1988 | Kriz | ................. | G03B 27/72 |
| | | | | 386/230 |
| 5,532,494 A * | 7/1996 | Kawanami | ............. | G01N 23/22 |
| | | | | 250/491.1 |
| 5,986,263 A * | 11/1999 | Hiroi | ................. | H01J 37/28 |
| | | | | 250/307 |
| 6,014,965 A * | 1/2000 | Nishida | ................ | G01R 31/308 |
| | | | | 125/12 |
| 7,589,544 B2 * | 9/2009 | Nakayama | ......... | G01R 31/2891 |
| | | | | 324/750.18 |
| 2009/0265030 A1 * | 10/2009 | Huang | ............... | G05B 19/4068 |
| | | | | 700/182 |

(Continued)

FOREIGN PATENT DOCUMENTS

| | | |
|---|---|---|
| JP | 2000-061804 | 2/2000 |
| JP | 2001-284303 | 10/2001 |
| JP | 2005-088053 | 4/2005 |

*Primary Examiner* — Reza Aghevli
(74) *Attorney, Agent, or Firm* — Greer Burns & Crain, Ltd.

(57) ABSTRACT

Disclosed herein is an apparatus including an imaging unit configured to image a region in which a holding unit is moved by operation of a moving unit, a basic image storage unit configured to store a basic image corresponding to proper operation of the holding unit or an action unit, and a controller configured to compare an image imaged by the imaging unit with the basic image stored by the basic image storage unit, and control the moving unit or the action unit such that the two images coincide with each other.

20 Claims, 4 Drawing Sheets

(56) References Cited

U.S. PATENT DOCUMENTS

| | | | | |
|---|---|---|---|---|
| 2010/0079623 A1* | 4/2010 | Tomita | H04N 5/232 | 348/240.99 |
| 2011/0075123 A1* | 3/2011 | Nagamori | G03F 9/7073 | 355/72 |
| 2011/0133066 A1* | 6/2011 | Nozoe | H01J 37/265 | 250/252.1 |
| 2012/0289028 A1* | 11/2012 | Abatake | B23K 26/032 | 438/463 |
| 2013/0306605 A1* | 11/2013 | Sekiya | B23K 26/0853 | 219/121.6 |
| 2014/0080289 A1* | 3/2014 | Morikazu | H01L 21/268 | 438/473 |
| 2014/0130613 A1* | 5/2014 | Adiga | G01N 1/06 | 73/863.01 |
| 2015/0139531 A1* | 5/2015 | Hirai | H01L 22/12 | 382/149 |
| 2015/0278625 A1* | 10/2015 | Finkbeiner | G02B 21/26 | 348/79 |
| 2015/0286001 A1* | 10/2015 | Konno | G02B 6/2555 | 348/95 |
| 2015/0287625 A1* | 10/2015 | Fujimoto | G01B 11/002 | 382/151 |
| 2016/0190020 A1* | 6/2016 | Kimura | G01R 31/265 | 438/16 |
| 2017/0236267 A1* | 8/2017 | Negishi | G06K 9/6201 | 348/87 |
| 2017/0243341 A1* | 8/2017 | Takeda | G01N 21/958 | |
| 2018/0151508 A1* | 5/2018 | Nakamura | H01L 21/268 | |
| 2018/0161919 A1* | 6/2018 | Yamada | H01L 21/67092 | |

* cited by examiner

FIG.3

Movement control - Basic image MAP

| Movement control | State | Image |
|---|---|---|
| (1) | Start | Basic image 1 |
| | Completion | Basic image 2 |
| (2) | Start | Basic image 3 |
| | Completion | Basic image 4 |
| (3) | Start | Basic image 5 |
| (7) | Start | Basic image 13 |
| | Completion | Basic image 14 |

APPARATUS HAVING TRANSFER CONTROL BASED ON IMAGED IMAGE

BACKGROUND OF THE INVENTION

Field of the Invention

The present invention relates to an apparatus including holding means for holding a workpiece, action means for applying action to the workpiece, and moving means for moving the holding means and the action means relative to each other.

Description of the Related Art

A wafer having a plurality of devices such as integrated circuits (ICs), large scale integrations (LSIs), or the like formed on the top surface of the wafer in a state of being demarcated by planned dividing lines is formed to a predetermined thickness by grinding the undersurface of the wafer by a grinding apparatus (see for example Japanese Patent Laid-Open No. 2001-284303), and is thereafter divided into individual device chips by a dicing apparatus (see for example Japanese Patent Laid-Open No. 2000-061804) or a laser processing apparatus (see for example Japanese Patent Laid-Open No. 2005-088053). The divided device chips are used in electric apparatuses such as mobile telephones, personal computers, or the like.

The dicing apparatus, for example, is constituted mainly of a chuck table as holding means for holding a wafer at a time of cutting processing, cutting means including a rotatable cutting blade that cuts the wafer held on the chuck table, processing feeding means for processing-feeding the chuck table and the cutting means relative to each other, indexing feeding means for indexing-feeding the chuck table and the cutting means relative to each other, a cassette table on which a cassette housing a plurality of wafers is mounted, carrying-out means for carrying out a wafer from the cassette to a temporary placement table, a transporting mechanism that transports the wafer temporarily placed on the temporary placement table to the chuck table, alignment means for imaging the wafer held on the chuck table and detecting a region to be cut, and cleaning means for cleaning the wafer already cut. The dicing apparatus can divide the wafer into individual device chips with high accuracy.

SUMMARY OF THE INVENTION

Here, in the dicing apparatus, the workpiece after being carried out from the cassette is moved by moving means corresponding to positions for subjecting the workpiece to actions such as cutting processing, cleaning, and the like, while the workpiece is held by various holding means. At this time, in order to ensure quality of processing of the semiconductor wafer as a precision apparatus, it is necessary to monitor movement by each of the moving means, and move the semiconductor wafer to the target positions accurately. It is therefore necessary for example to monitor movement by laying a linear scale in the traveling direction of each moving means, providing a reading head reading graduations on the linear scale, and counting the number of pulses detected from the reading head, or install, at each target position of each moving means, a sensor or a detecting switch turned on when the moving means reaches the target position, and provide means for monitoring whether the semiconductor wafer is moved to the target position accurately. Thus, there occur problems of complication of the constitution of the apparatus as a whole and an increase in cost of the apparatus. Incidentally, such problems occur in not only dicing apparatus but also any apparatus having means for moving a workpiece to an action position for applying action to the workpiece, the apparatus being a grinding apparatus, a laser processing apparatus, or the like.

It is accordingly an object of the present invention to provide an apparatus that can accurately move a workpiece to a predetermined position by moving means or monitor for an operation error without complication of the constitution of the apparatus or an increase in cost of the apparatus, the apparatus including holding means for holding the workpiece, action means for applying action to the workpiece, and the moving means for moving the holding means holding the workpiece relative to the action means.

In accordance with an aspect of the present invention, there is provided an apparatus including holding means for holding a workpiece, action means for applying action to the workpiece held by the holding means, moving means for moving the holding means and the action means relative to each other, imaging means for imaging a region in which the holding means is moved by operation of the moving means, basic image storing means for storing a basic image corresponding to proper operation of the holding means or the action means, and control means for comparing an image imaged by the imaging means with the basic image stored by the basic image storing means, and controlling the moving means or the action means such that the two images coincide with each other.

In addition, preferably, the apparatus further includes display means. The control means makes the display means make error display when the two images do not coincide with each other even after the control means compares the image imaged by the imaging means with the basic image stored by the basic image storing means and controls the moving means or the action means such that the two images coincide with each other. The apparatus can be applied to one of a dicing apparatus, a laser processing apparatus, and a grinding apparatus.

According to the present invention, an apparatus includes holding means, action means, imaging means for imaging a region in which the holding means is moved by operation of moving means, basic image storing means for storing a basic image corresponding to proper operation of the holding means or the action means, and control means for comparing an image imaged by the imaging means with the image stored by the basic image storing means, and controlling the moving means or the action means such that the images coincide with each other. Thus, it is not necessary to provide a plurality of sensors for monitoring the movement of the holding means. The problem of an increase in cost of the apparatus can therefore be solved without complication of the constitution of the apparatus that applies action to a workpiece.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 3 is a diagram of assistance in explaining a movement control-basic image MAP stored by the control means shown in FIG. 1.

DETAILED DESCRIPTION OF THE PREFERRED EMBODIMENT

Figure 1:
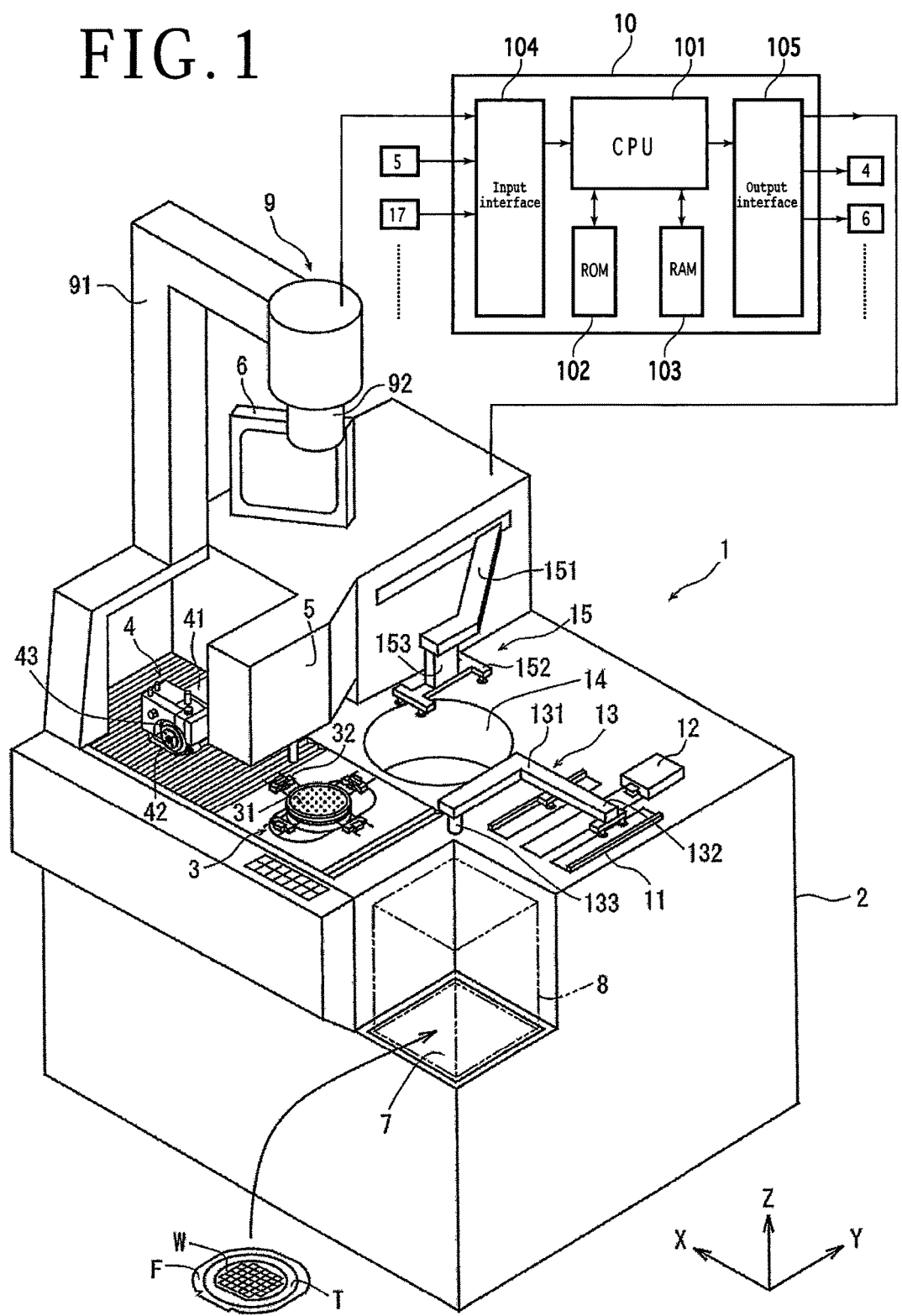
FIG. 1 is a general perspective view of a dicing apparatus and a block diagram of control means (controller), the dicing apparatus and the control means being configured on the basis of the present invention.

A preferred embodiment of an apparatus configured according to the present invention will hereinafter be described in detail with reference to the accompanying drawings. FIG. 1 is a general perspective view of a dicing apparatus configured according to the present invention. A dicing apparatus 1 in the embodiment shown in the figure has an apparatus housing 2 substantially in the shape of a rectangular parallelepiped. A chuck table 3 as holding means for holding a workpiece is disposed within the apparatus housing 2 so as to be movable in a direction indicated by an arrow X, which direction is a cutting feed direction. The chuck table 3 includes a suction chuck 31. The chuck table 3 sucks and holds the workpiece, for example a wafer in a disk shape, on a holding surface as a top surface of the suction chuck 31 by suction means (not shown). In addition, the chuck table 3 is configured to be rotatable by a rotating mechanism (not shown). Incidentally, the chuck table 3 is provided with clamps 32 for fixing an annular supporting frame F that supports a semiconductor wafer W, which will be described later as the workpiece, via a dicing tape T. The thus formed chuck table 3 is moved in the cutting feed direction indicated by the arrow X by cutting feed means (not shown).

The dicing apparatus 1 in the present embodiment includes a spindle unit 4 as processing means. The spindle unit 4 includes a spindle housing 41, a rotary spindle 42, and a cutting blade 43. The spindle housing 41 is mounted on a moving base (not shown) and is moved and adjusted in a direction indicated by an arrow Y, which direction is an indexing direction, and a direction indicated by an arrow Z, which direction is a cutting direction. The rotary spindle 42 is rotatably supported by the spindle housing 41 and is rotation-driven by a rotation driving mechanism (not shown). The cutting blade 43 is fitted to the rotary spindle 42.

The dicing apparatus 1 includes alignment means 5 for imaging the top surface of a wafer held on the holding surface, which is the top surface of the suction chuck 31 constituting the chuck table 3, detecting a region to be cut by the cutting blade 43, and aligning the region to be cut in the wafer with the cutting blade 43. The alignment means 5 includes optical means such as a microscope, a charge-coupled apparatus (CCD) camera, and the like. The alignment means 5 sends an imaged image signal to control means 10. The dicing apparatus 1 also includes display means 6 for displaying an image imaged by the alignment means 5, the details of a work command for an operator to be described later, a required time ratio, and the like.

The dicing apparatus 1 includes a cassette 8 housing a plurality of semiconductor wafers W as workpieces. Relation between a semiconductor wafer W as a workpiece and a supporting frame F and a protective tape T will be described in the following. The supporting frame F has an opening portion for housing the semiconductor wafer. The protective tape T is mounted so as to cover the opening portion. The semiconductor wafer W is stuck to the top surface of the protective tape T. The semiconductor wafer W thus supported by the supporting frame F via the protective tape T is housed in the cassette 8. In addition, the cassette 8 is mounted on a cassette table 7 disposed so as to be vertically movable in a cassette mounting part by raising and lowering means (not shown).

The dicing apparatus 1 further includes imaging means 9 above a center of the apparatus housing 2, the imaging means 9 being capable of imaging a work region of the apparatus housing 2. The imaging means 9 includes an L-shaped arm 91 extending upward from a right back side in the figure on which side the spindle unit 4 is installed in the apparatus housing 2, and an imaging unit 92 disposed at an end portion of the arm 91 with an imaging direction of the imaging unit 92 oriented downward. The imaging unit 92 for example includes a CCD element as an imaging apparatus and a wide-angle lens for enabling imaging of the whole of the work region on the apparatus housing 2. Incidentally, the imaging unit 92 may not include the wide-angle lens, but may be enabled to image the whole of the work region on the apparatus housing 2 by dividing the region on the apparatus housing 2 into four regions, for example, and configuring the imaging unit 92 to be able to switch the imaging direction toward each of the regions as required.

The dicing apparatus 1 includes workpiece carrying-in/out means 12 for carrying out the semiconductor wafer W as a workpiece from an action position of gripping the semiconductor wafer W housed in the cassette 8 to a carrying-out position on a temporary placement part 11, a first transporting mechanism 13 that transports the semiconductor wafer W carried out by the workpiece carrying-in/out means 12 onto the chuck table 3, cleaning means 14 for cleaning the semiconductor wafer W cut on the chuck table 3, and a second transporting mechanism 15 that transports the semiconductor wafer W cut on the chuck table 3 to the cleaning means 14. Incidentally, in the embodiment shown in the figure, the first transporting mechanism 13 has a function of a transporting mechanism for transporting the semiconductor wafer W cleaned by the cleaning means 14 to the temporary placement part 11.

The first transporting mechanism 13 will next be described. The first transporting mechanism 13 in the present embodiment includes an L-shaped actuating arm 131. The L-shaped actuating arm 131 has one end portion provided with a suction holding mechanism 132 that includes a sucking portion coupled to suction means (not shown) and which sucks and holds the workpiece, and has another end side provided with moving means 133 configured to be able to be raised and lowered and able to be rotated. The moving means 133 actuates the actuating arm 131 in a vertical direction in FIG. 1, and is coupled to a moving mechanism including an electric motor (not shown) capable of normal rotation and reverse rotation. Hence, the actuating arm 131 is rotated and moved about the moving means 133 by driving the moving mechanism in a normal rotation direction or a reverse rotation direction. Consequently, the actuating arm 131 is actuated in a horizontal plane, and the suction holding mechanism 132 as holding means fitted to one end portion of the actuating arm 131 is moved in the horizontal plane between the temporary placement part 11 and the cleaning means 14 as action means for subjecting the workpiece to a cleaning action or the chuck table 3.

The second transporting mechanism 15 will next be described. The second transporting mechanism 15 in the present embodiment includes an actuating arm 151. The actuating arm 151 has one end portion thereof coupled to a reciprocating mechanism (not shown) housed within the apparatus housing 2. Hence, a suction holding mechanism 152 fitted to another end portion of the actuating arm 151 and serving as holding means for sucking and holding the workpiece is moved in a horizontal plane between the cleaning means 14 and the chuck table 3.

The suction holding mechanism 152 fitted to the other end portion of the actuating arm 151 has a substantially H-shaped supporting plate provided with a suction member coupled to suction means (not shown). The suction holding mechanism 152 has a substantially identical constitution to that of the suction holding mechanism 132 of the first transporting mechanism 13.

The dicing apparatus 1 according to the present embodiment includes control means 10 as shown in FIG. 1. The control means 10 is formed by a computer. The control means 10 includes a central processing unit (CPU) 101 that performs arithmetic processing according to a control program, a read-only memory (ROM) 102 that stores the control program and the like, a readable and writable random access memory (RAM) 103 that stores an arithmetic result and the like, an input interface 104, and an output interface 105. Image signals from the alignment means 5 and the imaging means 9, an input signal from operating means, and the like are input to the input interface 104. Then, a driving signal for the spindle unit 4, signals for displaying images imaged by the alignment means 5 and the imaging means 9 by the display means 6, and the like are output from the output interface 105 of the control means 10.

The dicing apparatus equipped with the workpiece transporting mechanism configured according to the present invention is configured as described above. The actuation of the dicing apparatus will be described in the following with reference to FIG. 1. A semiconductor wafer W housed in a predetermined position of the cassette 8 is positioned at a carrying-out position by a vertical movement of the cassette table 7 by raising and lowering means (not shown). Next, the workpiece carrying-in/out means 12 advances and retreats to carry out the semiconductor wafer W positioned at the carrying-out position to the temporary placement part 11 (the above will be referred to as "cassette-to-temporary placement part transfer control"). The semiconductor wafer W carried out to the temporary placement part 11 is transported onto the mounting surface of the suction chuck 31 constituting the chuck table 3 by actuation of the actuating arm 131, the suction holding mechanism 132, and the moving means 133 constituting the first transporting mechanism 13 and the suction means (not shown) (the above will be referred to as "temporary placement part-to-chuck table transfer control").

The semiconductor wafer W transported onto the suction chuck 31 of the chuck table 3 by the first transporting mechanism 13 is released from the suction and hold of the suction holding mechanism 132 constituting the first transporting mechanism 13, and is sucked and held by the suction chuck 31. The chuck table 3 thus sucking and holding the semiconductor wafer W is moved to a position directly below the alignment means 5. When the chuck table 3 is positioned directly below the alignment means 5, the imaging element of the alignment means 5 detects a cutting line formed on the semiconductor wafer W, the chuck table 3 is rotated by a predetermined angle, and the spindle unit 4 is moved and adjusted in the arrow Y direction as the indexing direction, whereby work of precise alignment between the cutting blade 43 and the cutting line is performed (the above will be referred to as "alignment time movement control").

Thereafter, while the cutting blade 43 is rotated in a predetermined direction, the chuck table 3 sucking and holding the semiconductor wafer W is moved in the direction indicated by the arrow X (direction orthogonal to a rotating shaft of the cutting blade 43), which direction is the cutting feed direction, at a cutting feed speed of 30 mm/second, for example. The semiconductor wafer W held by the chuck table 3 is thereby cut along the predetermined cutting line by the cutting blade 43. That is, because the cutting blade 43 is mounted on the spindle unit 4 positioned by being moved and adjusted in the direction indicated by the arrow Y, which direction is the indexing direction, and in the direction indicated by the arrow Z, which direction is the cutting direction, and the cutting blade 43 is rotation-driven, the semiconductor wafer W held by the chuck table 3 is cut along the predetermined cutting line by the cutting blade 43 by moving the chuck table 3 in the cutting feed direction along the lower side of the cutting blade 43. When the cutting of the semiconductor wafer W along all of cutting lines is completed, the semiconductor wafer W is divided into individual semiconductor device chips. The divided semiconductor device chips do not fall apart due to the action of the protective tape T, and the state of the semiconductor wafer W supported by the supporting frame F is maintained. After the cutting of the semiconductor wafer W is thus ended, the chuck table 3 holding the semiconductor wafer W is returned to the position where the semiconductor wafer W is first sucked and held. At this position, the semiconductor wafer W is released from the suction and hold (the above will be referred to as "cutting time movement control").

Next, the semiconductor wafer W divided into the individual semiconductor device chips which semiconductor wafer is released from the suction and hold on the chuck table 3 is sucked and held by the suction holding mechanism 152 by actuation of the actuating arm 151 and raising and lowering means 153 constituting the second transporting mechanism 15 and the reciprocating mechanism and the suction means (not shown), and is transported to the cleaning means 14 (the above will be referred to as "chuck table-to-cleaning means transfer control").

The semiconductor wafer W divided into individual semiconductor device chips which semiconductor wafer has been transported to the cleaning means 14 as described above is cleaned by the cleaning means 14, and dirt such as contaminations or the like generated during the cutting is removed from the semiconductor wafer W. The semiconductor wafer W cleaned by the cleaning means 14 is sucked by the suction holding mechanism 132 of the first transporting mechanism 13, carried by movement of the actuating arm 131, and is transported to the temporary placement part 11 (the above will be referred to as "cleaning means-to-temporary placement part transfer control"). The semiconductor wafer W transported to the temporary placement part 11 is housed in a predetermined position of the cassette 8 by the workpiece carrying-in/out means 12 (the above will be referred to as "temporary placement part-to-cassette transfer control").

As described above, the dicing apparatus in the present embodiment is provided with movement controls that hold the workpiece by actuating holding means for holding the workpiece and move the holding means relative to action means for subjecting the workpiece to action by actuating moving means for moving the holding means during a period from the carrying out of the semiconductor wafer from the cassette housing the semiconductor wafer as the workpiece to the housing of the semiconductor wafer in the cassette again after cutting processing and cleaning. The movement controls sequentially perform (1) "cassette-to-temporary placement part transfer control," (2) "temporary placement part-to-chuck table transfer control," (3) "alignment time movement control," (4) "cutting time movement control," (5) "chuck table-to-cleaning means transfer control," (6) "cleaning means-to-temporary placement part transfer control," and (7) "temporary placement part-to-cassette transfer control."

Here, the action means in each of the movement controls is the temporary placement part 11 in "cassette-to-temporary placement part transfer control," the chuck table 3 in "temporary placement part-to-chuck table transfer control," the alignment means 5 in "alignment time movement control," the spindle unit 4 in "cutting time movement control," the cleaning means 14 in "chuck table-to-cleaning means transfer control," the temporary placement part 11 in "cleaning means-to-temporary placement part transfer control," and the cassette 8 in "temporary placement part-to-cassette transfer control." The holding means for holding the semiconductor wafer W as the workpiece while the holding means is moved to the action means in each of the movement controls is the workpiece carrying-in/out means 12, the suction holding mechanism 132, the suction holding mechanism 152, and the chuck table 3. The moving means is means for moving each holding means.

The dicing apparatus 1 according to the present embodiment is actuated as described above on the basis of a main program stored by the control means 10 provided to the dicing apparatus 1. The control means 10 configured on the basis of the present invention further includes a movement control monitoring program executed on the basis of a flowchart shown in FIG. 2. The movement control monitoring program is repeatedly executed in a predetermined period while the movement controls (1) to (7) are performed on the basis of the main program. On the basis of the movement control monitoring program, the control means is configured to compare an image imaged by the imaging means with a basic image to be described later by image processing means and control the moving means or the action means such that the two images coincide with each other. Details of the movement control monitoring program will be described in the following.

As a precondition for executing the above-described program, in the ROM of the control means 10, basic images obtained by imaging positional relation between particular elements at start times and completion times of movements in a case where the moving means and the action means are controlled properly are classified and stored as in a "movement control-basic image MAP" shown in FIG. 3 in correspondence with (1) "cassette-to-temporary placement part transfer control," (2) "temporary placement part-to-chuck table transfer control," (3) "alignment time movement control," (4) "cutting time movement control," (5) "chuck table-to-cleaning means transfer control," (6) "cleaning means-to-temporary placement part transfer control," and (7) "temporary placement part-to-cassette transfer control" individually, described above.

The MAP, for example, stores a "basic image 1" in a section of a start state of the movement control (1) ("cassette-to-temporary placement part transfer control"). The basic image 1 is an image obtained by imaging a transfer start state in which the cassette 8 is on the cassette table 7, the workpiece carrying-in/out means 12 is in proximity to the cassette 8 and is at an action position of gripping the frame F supporting the housed semiconductor wafer W before processing, and the wafer W is not on the temporary placement part 11. In addition, a "basic image 2" is stored in a section of a completion state of the movement control (1). The basic image 2 is an image obtained by imaging a state in which the cassette 8 is on the cassette table 7, the semiconductor wafer W extracted from the cassette 8 by the workpiece carrying-in/out means 12 has been carried out onto the temporary placement part 11, and the semiconductor wafer W is in a specified position on the temporary placement part 11. Similarly to these basic images, all of basic images 1 to 14 at start times and completion times of the respective movement controls (1) to (7) are stored.

Figure 2:
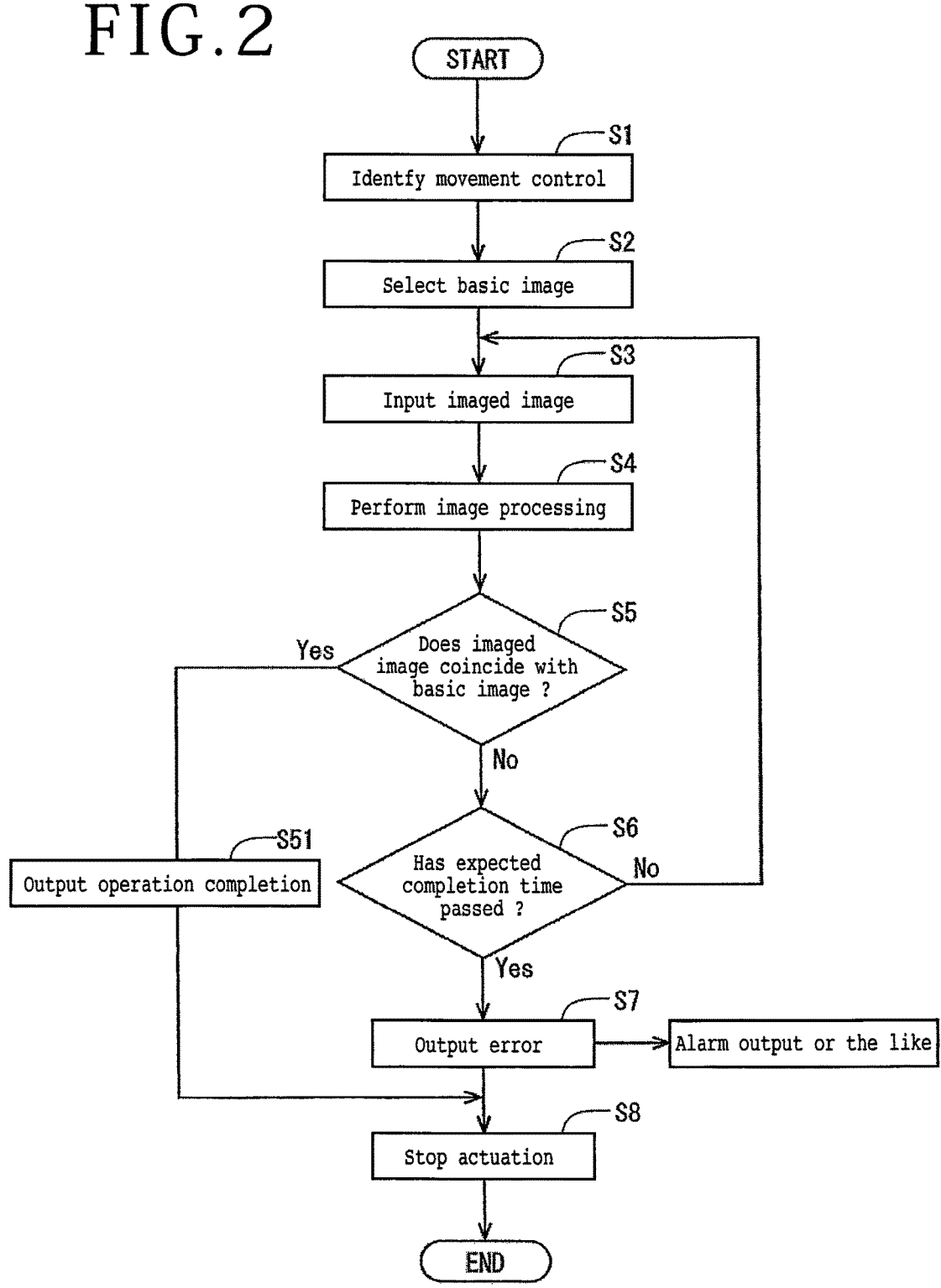
FIG. 2 is a flowchart of a control program executed by the control means of the dicing apparatus shown in FIG. 1.
Figure 4:
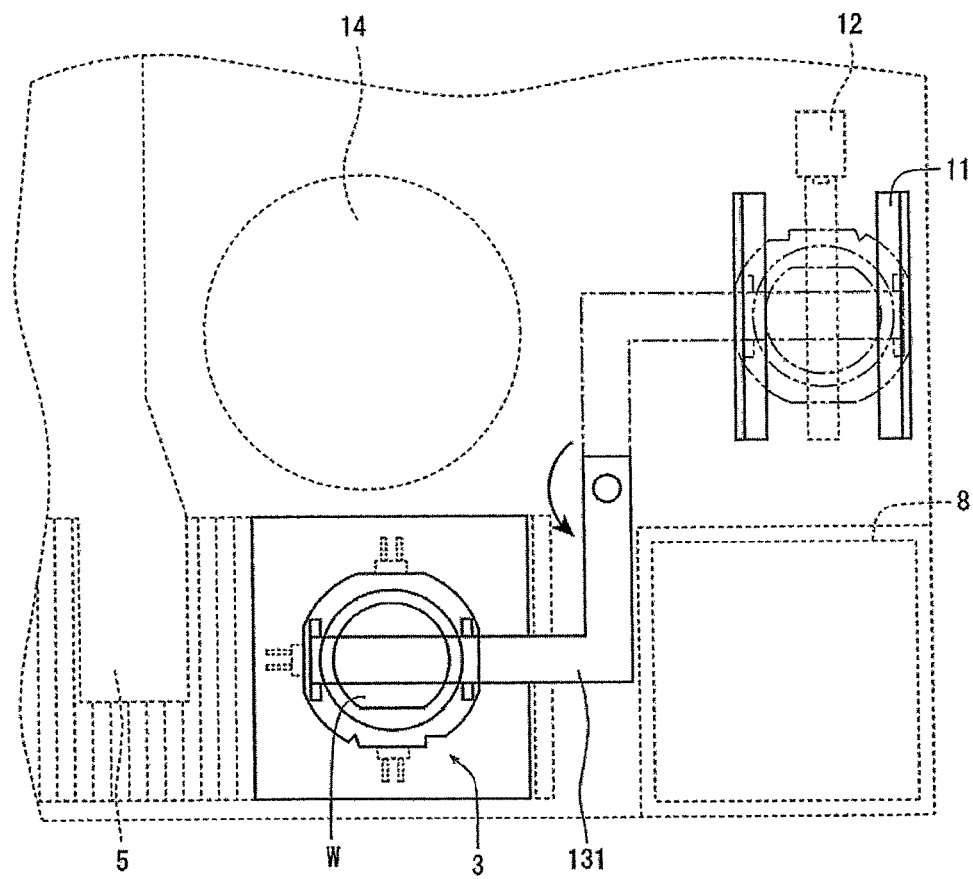
FIG. 4 is a diagram of assistance in explaining operation in which moving means is controlled by a control program executed according to the present invention.

Continuing the description on the basis of in FIG. 2, when processing in the dicing apparatus 1 is started, a present movement control stage is identified, and the movement control to be performed next is identified (step S1). Here, for example, suppose that the dicing apparatus 1 is identified as being in a stage in which the semiconductor wafer W has been transported from the cassette 8 and is mounted in the specified position on the temporary placement part 11, and the movement control (2) ("temporary placement part-to-chuck table transfer control") is to be hereafter performed by the control means 10. On the basis of determination in step S1, referring to the "movement control-basic image MAP" of FIG. 3, the basic image 4 shown in FIG. 4 is selected from a section of MOVEMENT CONTROL=(2) and TARGET STATE="COMPLETION" (step S2). The basic image 4 is stored in advance as an image resulting from image processing of an image obtained by imaging a state in a case where temporary placement part-to-chuck table transfer control is completed properly. The basic image 4 is an image indicating a state in which specific elements (the semiconductor wafer W, the actuating arm 131 of the first transporting mechanism 13, and the chuck table 3), in particular, serving as determination criteria for determining proper control at the time of the movement control in question are at positions indicating completion of the movement. That is, the basic image 4 is an image in which the positions of the above-described specific elements indicated by solid lines are recorded after the positions are extracted from an image showing completion of transfer of the semiconductor wafer W onto the chuck table 3 that applies suction action to the workpiece, during which transfer the suction holding mechanism 132 as the holding means provided to an end portion of the actuating arm 131 of the first transporting mechanism 13 holds the semiconductor wafer W. When the basic image 4 is selected in step S2, the main program is executed, and thereby temporary placement part-to-chuck table transfer control is actually started, so that the actuating arm 131 of the first transporting mechanism 13 is driven by the moving means 133 to transfer the semiconductor wafer W toward the chuck table 3. To monitor this operation, the imaging means 9 images an imaging region including all of the temporary placement part 11, the first transporting mechanism 13, and the chuck table 3 identified as the above-described specific elements, and inputs the image to the control means 10 (step S3).

The image data input to the control means 10 in step S3 is subjected to image processing, the positional relation of each of the extracted specific elements is identified, and whether or not the positional relation of each of the extracted specific elements coincides with the positional relation of each of the specific elements located at proper positions recorded in the basic image 4 is determined (step S5). Incidentally, in the determination, in order to facilitate the determination based on the image processing, only the positional relation of the specific elements is checked, and coinciding relation of the other elements represented by dotted lines is not determined. Here, when it is determined that the position of each of the specific elements imaged by the imaging means 9 and extracted by the image processing does not coincide with the positional relation of the basic image 4 (No), the processing proceeds to step S6. When an expected completion time from a start of transfer operation to a completion state of the transfer is not exceeded, a return is made to step S3 to repeat steps S3 to S5. In addition, when it is determined in step S5 that the imaged image and the positional relation of the specific elements in the basic image coincide with each other (Yes), it is determined that the operation for bringing about the completion state of the movement control (2) being performed is ended properly. Thus, a signal indicating completion of the operation is output (step S51). The processing proceeds to step S8, where the actuation of the movement control (2) is stopped.

In addition, when it is repeatedly determined that the position of each of the specific elements imaged by the imaging means 9 and extracted by the image processing does not coincide with the positional relation in the basic image 4 (No), and the proper expected completion time from the start of the transfer control to the completion state is exceeded on the basis of the determination in step S6, it is determined that the proper operation is not performed. The processing therefore proceeds to step S7, where error information is output. The error output is recorded in the RAM of the control means 10, and error display for the display means 6, a warning buzzer, or the like is output as required. Then, after the error information is output, the processing proceeds to step S8, where the actuation of the dicing apparatus is stopped. Incidentally, the actuation of the movement control is stopped in step S8 in both of the case where the movement control is performed properly within the predetermined time and thus the imaged image coincides with the basic image and the case where the error information is output without the imaged image coinciding with the basic image. In the case where it is determined in step S5 that the imaged image coincides with the basic image and the actuation is stopped, the signal indicating the completion of the operation is output, and the error information is not recorded. A transition to the next movement control can therefore be made immediately on the basis of the main program. On the other hand, in the case where the imaged image does not coincide with the basic image within the predetermined time, the error information is output, and then the operation is stopped, the error information is recorded by the control means 10. A transition to the next movement control on the basis of the main program is thereby prohibited until the error information is canceled.

After control that brings about the completion state of the movement control (2) is ended, the operation of the dicing apparatus makes a transition to the next movement control (3) "alignment time movement control" on the basis of the main program, and the control program shown in FIG. 2 is executed again. Thus, control similar to the foregoing is performed repeatedly until all of the movement controls are ended. Incidentally, the above-described control can be similarly performed in not only cases where the workpiece is transferred toward the action means as described above but also cases where processing is performed while the action means is moved relative to the workpiece. For example, in a case where the movement control (4) "cutting time movement control" is selected, the chuck table 3 as the holding means, the semiconductor wafer W as the workpiece, and the spindle unit 4 as the action means are set as specific elements, the basic image in which the proper position of each of the specific elements is recorded so as to correspond to an elapsed time is selected, and whether or not the positional relation of the specific elements extracted by the image processing from an image imaged by the imaging means 9 coincides with proper positional relation recorded in the basic image is determined. Incidentally, in this case, the chuck table 3 as the holding means is moved relative to the spindle unit 4 as the action means, and the spindle unit 4 is moved in the indexing feed direction (Y-axis direction). The movement control can be monitored for proper performance of the movement control by storing the basic image and executing the movement control monitoring program as appropriate.

In the present embodiment, the basic images of the start and completion states of the movement controls are recorded, and whether the states corresponding to the basic images coincide with imaged images is determined. However, the present invention is not limited to this. It is possible to store basic images in correspondence with a plurality of points from a start of movement control to completion of the movement control, and monitor for proper actuation of the movement control at each of the plurality of points.

Further, in the present embodiment, description has been made of an example in which one imaging means 9 is installed above the center of the apparatus housing 2. However, a plurality of such imaging means may be provided. Providing a plurality of imaging means in correspondence with regions to which the workpiece is transferred makes it possible to set imaging angles that enable the movement controls to be monitored more appropriately. In addition, in the present embodiment, the imaging means 9 is installed so as to have an imaging angle on a downward side. However, without limitation to this, imaging means for imaging in a horizontal direction may be provided separately as required. As described above, the spindle unit 4 and the cassette 8 operate also in a vertical direction (Z-axis direction). Although it is possible to monitor positional changes of the spindle unit 4 and the cassette 8 by using images imaged from obliquely above, the operation of the spindle unit 4 and the cassette 8 can be monitored more accurately when the spindle unit 4 and the cassette 8 are imaged from the horizontal direction.

In addition, the present embodiment illustrates an example in which the present invention is applied to a dicing apparatus. However, the present invention can be applied also to laser processing apparatus and grinding apparatus, and can be applied also to any apparatus as long as the apparatus includes holding means for holding a workpiece, action means for applying action to the workpiece held by the holding means, and moving means for moving the holding means and the action means relative to each other.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. An apparatus comprising:
    a holding means for holding a workpiece;
    an action means for applying action to the workpiece held by the holding means;
    a moving means for moving the holding means and the action means relative to each other;
    an imaging means for imaging a region in which the holding means is moved by operation of the moving means, wherein the region includes at least two of the following specific elements: the workpiece, the holding means and the action means;
    a basic image storing means for storing a basic image corresponding to proper operation of the holding means or the action means, wherein the basic image storing means includes a memory; and a control means for comparing an image imaged by the imaging means with the basic image stored by the basic image storing means, and controlling the moving means or the action means such that the two images coincide with each other, wherein the comparing an image imaged by the imaging means with the basic image includes verifying that a positional relation between at least two of said specific elements of the region imaged by the imaging means coincides with a corresponding positional relation in the basic image stored in the basic image storing means.

2. The apparatus according to claim 1, further comprising:
a display means,
wherein the control means makes the display means make error display when the two images do not coincide with each other even after the control means compares the image imaged by the imaging means with the basic image stored by the basic image storing means and controls the moving means or the action means such that the two images coincide with each other.

3. The apparatus according to claim 1, wherein the apparatus is one of a dicing apparatus, a laser processing apparatus, and a grinding apparatus.

4. The apparatus according to claim 1, wherein the action means is selected from the group consisting of a temporary placement part, a chuck table, an alignment means, a spindle unit, a cleaning means, and a cassette.

5. The apparatus according to claim 1, wherein the holding means is selected from the group consisting of a chuck table, a suction holding mechanism fitted to an actuating arm, and a workpiece carrying-in/out means.

6. The apparatus according to claim 1, wherein said moving means is configured and arranged for moving an associated one of said holding means from a position associated with one of said action means to a position associated with another of said action means.

7. The apparatus according to claim 1, wherein:
the action means is a chuck table; and
the holding means is a suction holding mechanism fitted to an actuating arm.

8. The apparatus according to claim 1, wherein:
the action means is an alignment means; and
the holding means is a chuck table.

9. The apparatus according to claim 1, wherein:
the action means is a cleaning means; and
the holding means is a suction holding mechanism fitted to an actuating arm.

10. The apparatus according to claim 1, wherein:
the action means is a cassette; and
the holding means is a workpiece carrying-in/out means.

11. An apparatus comprising:
a holding means for holding a workpiece;
an action means for applying action to the workpiece held by the holding means;
a moving means for moving the holding means and the action means relative to each other, wherein the moving means includes an actuating arm coupled to a motor;
an imaging means for imaging a region in which the holding means is moved by operation of the moving means;
a basic image storing means for storing a basic image corresponding to proper operation of the holding means or the action means, wherein the basic image storing means includes a memory; and
a control means for comparing an image imaged by the imaging means with the basic image stored by the basic image storing means, and controlling the moving means or the action means such that the two images coincide with each other, wherein the comparing an image imaged by the imaging means with the basic image includes verifying that a positional relation between at least two specific elements of the region imaged by the imaging means coincides with a corresponding positional relation of said at least two specific elements in the basic image stored in the basic image storing means.

12. The apparatus according to claim 11, further comprising:
display means,
wherein the control means makes the display means make error display when the two images do not coincide with each other even after the control means compares the image imaged by the imaging means with the basic image stored by the basic image storing means and controls the moving means or the action means such that the two images coincide with each other.

13. The apparatus according to claim 11, wherein the apparatus is one of a dicing apparatus, a laser processing apparatus, and a grinding apparatus.

14. The apparatus according to claim 11, wherein the action means is selected from the group consisting of a temporary placement part, a chuck table, an alignment means, a spindle unit, a cleaning means, and a cassette.

15. The apparatus according to claim 11, wherein the holding means is selected from the group consisting of a chuck table, a suction holding mechanism fitted to an actuating arm, and a workpiece carrying-in/out means.

16. An apparatus, wherein the apparatus includes a plurality of positions each configured and arranged for performing an action upon a workpiece, the apparatus comprising:
a holding means for holding the workpiece;
a moving means for moving the holding means with the workpiece thereon from one of said positions to another of said positions;
an imaging means for imaging a region in which the holding means is moved by operation of the moving means;
a basic image storing means for storing a basic image corresponding to proper operation of the holding means, wherein the basic image storing means includes a memory; and
a control means for comparing an image imaged by the imaging means with the basic image stored by the basic image storing means, and controlling the moving means such that the two images coincide with each other, wherein the comparing an image imaged by the imaging means with the basic image includes verifying that a positional relation between at least two specific elements of the region imaged by the imaging means coincides with a corresponding positional relation of said at least two specific elements in the basic image stored in the basic image storing means.

17. The apparatus according to claim 16, further comprising:
display means,
wherein the control means makes the display means make error display when the two images do not coincide with each other even after the control means compares the image imaged by the imaging means with the basic image stored by the basic image storing means and controls the moving means or the action means such that the two images coincide with each other.

18. The apparatus according to claim 17, wherein:
the apparatus is a dicing apparatus, that includes a spindle unit configured and arranged to dice the workpiece with a rotating cutting blade,
the holding means comprises a chuck table, and
the moving means comprises means for moving the chuck table to and from an operational position with respect to the spindle unit.

19. The apparatus according to claim 1, wherein the basic image comprises:
a first basic image depicting a start state of the specific elements in the region; and
a second basic image of a completion state of the specific elements in the region.

20. The apparatus according to claim 11, wherein the basic image comprises:
a first basic image depicting a start state of the specific elements in the region; and
a second basic image of a completion state of the specific elements in the region.

* * * * *